United States Patent [19]

Rudolph et al.

[11] Patent Number: 4,694,570
[45] Date of Patent: Sep. 22, 1987

[54] SURFACE MOUNTED COMPONENT TRANSPORT MECHANISM

[75] Inventors: John M. Rudolph, Carlsbad; George M. Wohlhieter, Santa Maria, both of Calif.

[73] Assignee: AMISTAR Corporation, Torrance, Calif.

[21] Appl. No.: 800,217

[22] Filed: Nov. 21, 1985

[51] Int. Cl.⁴ .............................................. H05K 3/30
[52] U.S. Cl. ...................................... 29/740; 29/759
[58] Field of Search ................... 29/740, 741, 836-840, 29/759

[56] References Cited

U.S. PATENT DOCUMENTS 4,372,802  2/1983  Harigane et al. .................. 29/740 X
4,520,557  6/1985  Harigane et al. ...................... 29/740

Primary Examiner—Carl E. Hall
Attorney, Agent, or Firm—John Holtrichter, Jr.

[57] ABSTRACT

There is herein described an improved surface mounted component (SMC) transport mechanism which accepts a multiple number of such components from a plurality of carrier media and transports them to a desired location, for example, adjacent a printed circuit board (PCB) prior to the mounting of the SMC onto the PCB.

9 Claims, 6 Drawing Figures

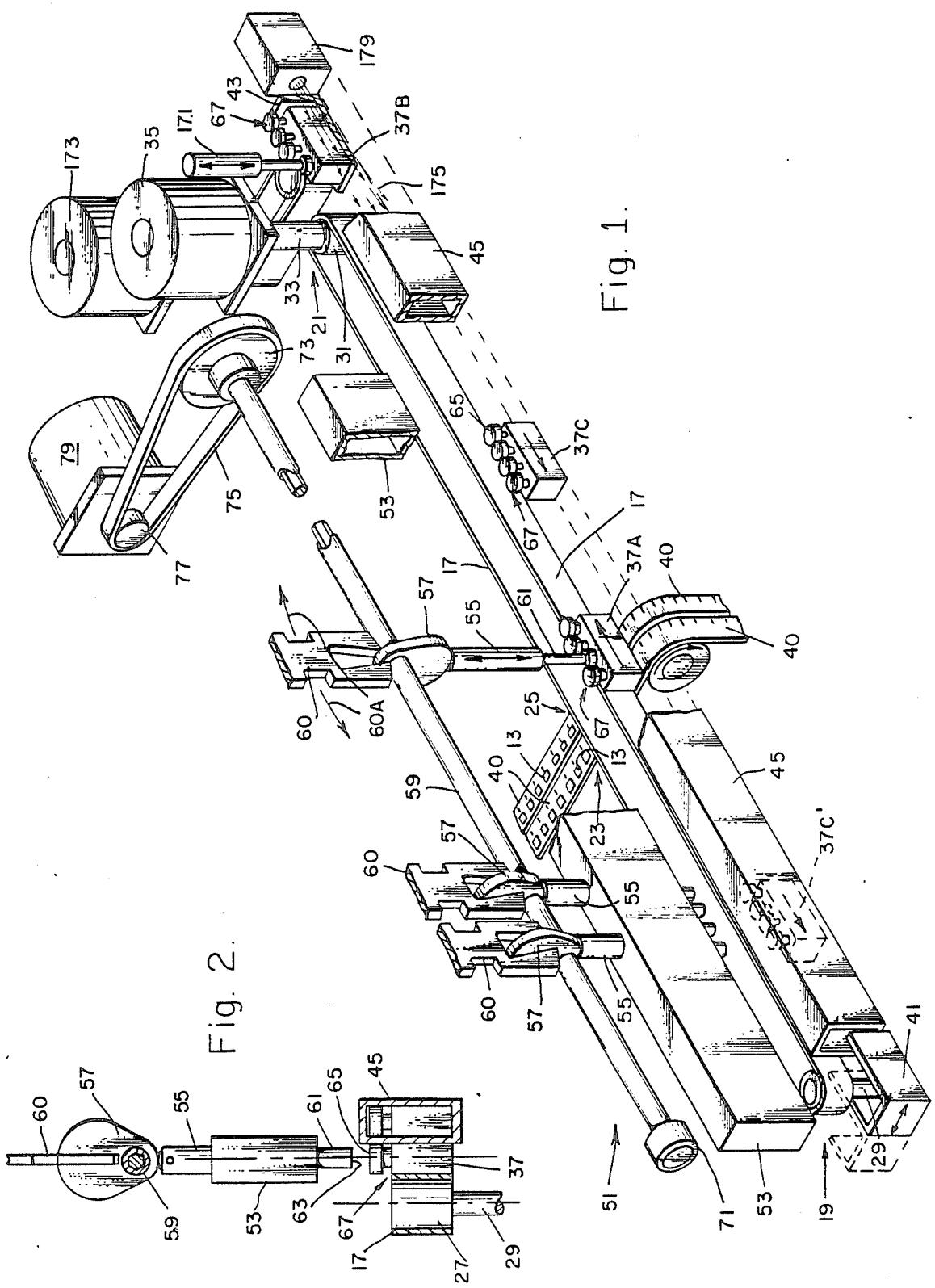

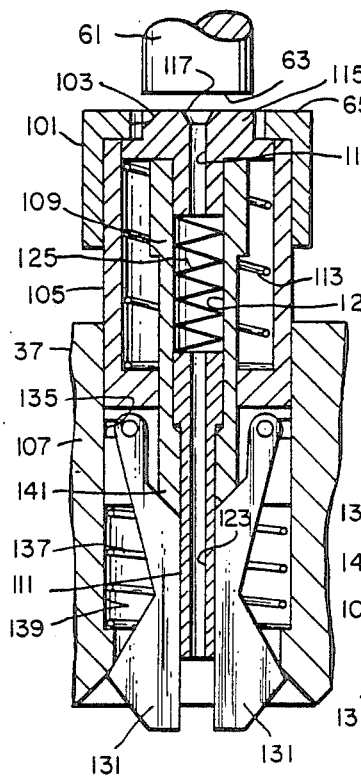
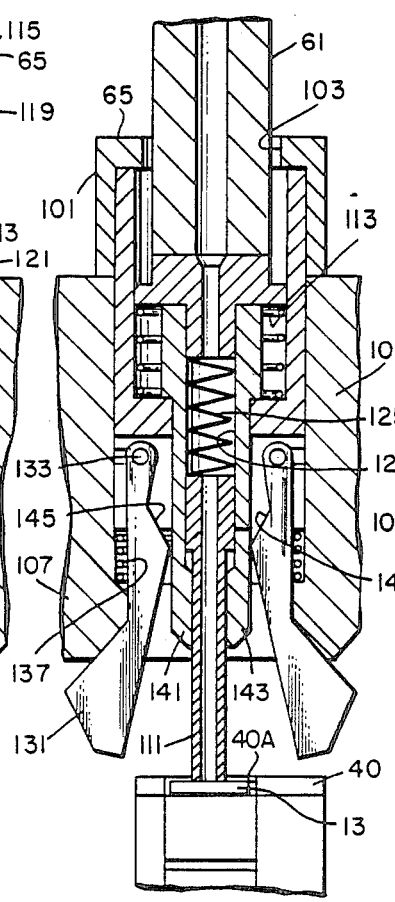
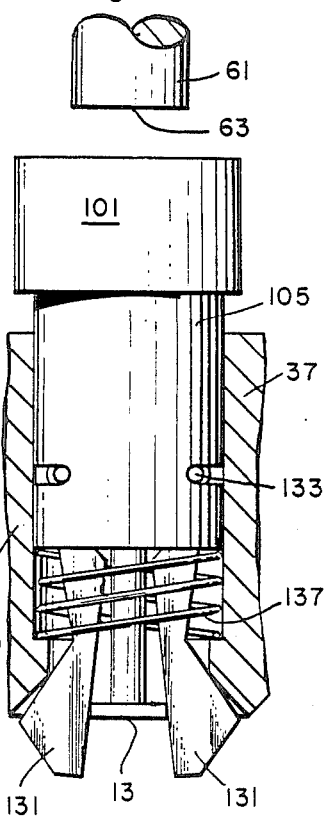
Fig. 4.  Fig. 5.  Fig. 6.
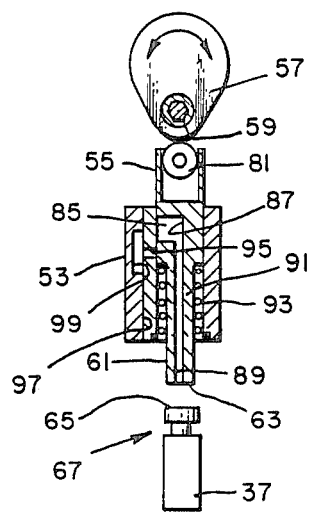
Fig. 3.

SURFACE MOUNTED COMPONENT TRANSPORT MECHANISM

TECHNICAL FIELD

This invention relates to the electronics manufacturing industry and more particularly to apparatus for transporting and mounting electronic components, particularly surface mounted components, onto printed circuit boards.

BACKGROUND ART

The mounting of discrete electrical components onto printed circuit boards by automated means is well known. For many years the mounting of such components having leads has been accomplished by hand. This is a tedious time-consuming and costly procedure which is especially true where miniature diodes, capacitors, resistors and transistors are concerned. Over the years, several types of apparatus has been developed to automate this procedure and thereby increase production. Basically, these machines align the components and their leads with respect to lead holes in the printed circuit board to be populated, and then insert the leads into the appropriate holes. The leads are then bent over or clinched to retain the components on the board prior to a soldering operation which both mechanically and electrically bonds the component to the board. In more recent times, however, a new electrical component packaging technique has been developed which does not require through-hole insertion. These are known as surface mounted components (SMC).

Surface mounted components lack or eliminate the long leads associated with through-hole mounted components. SMC's are finding wide use in the electronic industry, and like their leaded counterparts, require accurate placement on printed circuit boards, or other substrate media, prior to soldering. Accordingly, automatic machines have been developed to accomplish this task.

In an early SMC-delivering machine, the components are fed via tubes and apertures and are positioned on a slidable plate, situated over a printed circuit board, in a position which corresponds to the desired position of the components on the board. Subsequently, the plate is displaced while the components are retained so that the components ultimately drop onto the substrate. Due to the uncontrolled dropping motion, there is a risk that the components will tilt, rotate, or land in an incorrect position on the board.

In U.S. patent application No. 4,393,579 a device for mounting chip-type electronic components on a substrate is disclosed which is designed to enable accurate positioning and mounting of chip-type components in a controlled and reproducible manner. This device includes a slide having a recess for accommodating and transporting a component. The component is linearly displaceable in a guide between a loading position and an unloading position, and a suction device which is displaceable in the vertical direction serves to pick up a component from the slide when the latter is in the unloading position, and then move the component downward through a passage in the guide to position the picked up component onto the substrate positioned underneath the guide. Although this is an improvement over the previously known art, it still leaves much to be desired in speed of operation and reliability.

Also according to the prior art according to U.S. patent application No. 4,381,601, there is disclosed a method for mounting electronic components such as semiconductor pellets to the tip end of an attraction nozzle, holding and automatically orienting the sucked electronic component by means of a plurality of arms arranged along the outer periphery of the tip end of the sucking nozzle, transferring the held electronic component to a predetermined bonding position on a semiconductor device substrate, and opening the arms to bring down the electronic component onto the predetermined bonding position for bonding. Although this apparatus is adequate for the task of picking up and depositing a component, it does not include a fast and reliable means for transporting the component from an input station to an output station.

Stated in another way, the prior art is typified by transport means where components are positioned in a single row or on a semicircle so that the exposed SMC is presented at a consistent pick up point. A pick up device moves to the next required SMC and typically using a vacuum stylus, removes the SMC from its cavity. The pick up device then moves the single SMC to a predetermined location above the printed circuit board, placing the SMC thereon. This fetch and place cycle is repeated until the board is populated. Due to the pick up device speed, this prior art concept limits machines to 2,000 to 3,000 parts per hour.

In medium throughput (5,000 to 7,000 parts per hour) prior art machines, the SMC pick up device is commonly configured so as to move it a small linear distance, just in clearance of the reel, prior to placing a single SMC on the printed circuit board. As the pick up location is fixed, the desired reel must be moved to this location for SMC removal from the appropriate carrier cavity. The reels are typically moved and positioned with a precision lead screw using a servo drive or, in one design, a carousel. By careful programming, the reel-to-reel index time can be minimized, but generally any long reel index will pace the placement cycle speed.

Prior art high speed (9,000 to 15,000 parts per hour) machines place one component at a time, usually incorporating a sequencer to supply SMC to the placement head. As the name implies, sequencers stage (queue) up SMC in their proper order prior to actually being needed for placement. As SMC are being placed on a printed circuit board, another queue of SMC is being developed for the next board in order to keep the speed high. Occasionally, an individual SMC may be dropped or "lost" causing a gap in the queue which, in turn, results in a missed location on the board. It is clear that 100 percent populated printed circuit boards are required to justify the purchase of automatic assembly machines, so "repair" of the missing SMC should be accomplished when discovered.

The latter type high volume machines now generally incorporate means for "repairing" missed SMC by removing the printed circuit board in question, finishing the next board placement sequence, and returning the questionable board for repair. Obviously, this greatly increases handling time (non-placement time), lowers the net placement speed. It should, therefore, be evident that a relatively simple yet reliable random access electrical component mounting system which obviated the aforementioned shortcomings would constitute a significant advancement in the art.

SUMMARY OF THE INVENTION

In view of the foregoing factors and conditions characteristic of the prior art, it is a primary object of the present invention to provide a new and improved random access surface mounted component transporting system.

Another object of the present invention is to provide a simple yet reliable surface mounted component transporting and mounting system that is capable of transporting for mounting of the order of 14,400 parts per hour.

Still another object of the present invention is to provide a random access SMC transporting system which eliminates the problems associated with prior art sequencers.

Yet another object of the present invention is to provide a random access SMC transport system which detects a dropped or missing SMC prior to mounting onto a printed circuit board.

A further object of the present invention is to provide an SMC transporting mechanism which simultaneously moves a plurality of SMC from pick-up locations to an off loading location.

In accordance with an embodiment of the present invention, a random access surface mounted component transport system used in the population of surface mounted components (SMC) in printed circuit board (PCB) fabrication includes an elongated movement mechanism including a multiple SMC carrier, the mechanism having a plurality of adjacent loading points and a downstream off-loading station; a plurality of adjacent SMC carrier media disposed adjacent the movement mechanism, each SMC carrier media being associated with a different one of the loading points; loading means positioned adjacent the loading points and the SMC carrier media for moving selected SMC from the carrier media to the multiple SMC carrier of the movement mechanism for transportation to the off-loading station; and unloading means positioned adjacent the off-loading station for moving the SMC from the movement mechanism to an appropriate position on a PCB in a predetermined sequence.

The elongated movement mechanism may include a timing belt servo drive system with a continuous timing belt and have a longitudinal axis, and the adjacent SMC carrier media may be disposed adjacent the timing belt sequentially along the longitudinal axis.

Also, a plurality of multiple SMC carriers (bus) each capable of holding a multiple number of SMC, the carriers being temporarily attachable to the aforementioned timing belt.

The features of the present invention which are believed to be novel are set forth with particularity in the appended claims. The present invention, both as to its organization and manner of operation and use, together with further objects and advantages thereof, may best be understood by making reference to the following description taken in conjunction with the accompanying drawings in which like reference characters refer to like elements in the several views.

BRIEF DESCRIPTION OF THE DRAWINGS

FIG. 1 is a perspective view of a random access chip selection station in accordance with an embodiment of the present invention;

FIG. 2 is a side elevational view of a portion of the embodiment of the invention shown in FIG. 1;

FIG. 3 is a diagramatic sketch of a portion of the manifold portion of the SMC pick up device, in accordance with the invention, prior to its activation and showing the vacuum porting structure therein;

FIG. 4 is an enlarged view in cross-section of the chuck portion of the multiple SMC carrier shown in FIGS. 1 and 3, prior to being actuated;

FIG. 5 shows the chuck of FIG. 4 in its fully actuated, SMC pick-up configuration; and FIG. 6 is the chuck portion of the device of FIG. 3, in its SMC holding configuration.

DESCRIPTION OF THE PREFERRED EMBODIMENTS

Referring now to the drawings and more particularly to FIGS. 1 and 2, there is shown a random access surface mounted component transport system 11 used in the population of leadless surface mounted components (SMC) 13 in printed circuit board (PCB) fabrication. The system 11 includes a timing belt servo drive system having a timing belt 17, a first end 19 and a second end 21 generally defining there between a longitudinal axis, and having there along a plurality of adjacent intermediate on-loading points 23, 25, for example. The first end 19 of the timing belt system 15 is rotatably supported by a first pulley 27 mounted on an axle 29, while the other end is driven by a second pulley 31 mounted on an axle 33 which is rotated by an appropriate high speed servo motor 35.

This embodiment of the present invention uses a pick up means including three buses 37A–C, each having four cavities 39, each for accepting a single SMC 13 from a SMC carrier tape 40. Each such bus is adapted to be indexed to and mesh with the timing belt 17 when brought into contact there with. The pick up means also includes a simple first end lateral movement bracket 41 and a similar second end bracket 43 cyclically movable in a direction orthogonal to the aforementioned longitudinal axis by a simple pneumatic cylinder arrangement not shown for the sake of simplicity. Further, a return guide or chute 45 is provided which will accommodate the free sliding of the bus's 37 there within and along the length thereof and between the first and second brackets 41 and 43.

The invention also includes an overhead cam assembly 51 having an elongated vacuum manifold 53, a plurality of bus actuators or shafts 55 axially slidably mounted in the manifold 53, an overhead cam 57 associated with each of the actuators 55 and coupled to an elongated cam shaft 59, as provided by a forked shift mechanism 60. The actuators 55 each include major shaft portion and a reduced diameter portion 61 extending below the manifold 53, the lower end 63 of which is adapted to push down on an upper surface 65 of an associated multiple SMC carrier (bus)-holding mechanism 67, four of which mechanisms 67 (in this embodiment) are carried by each bus 37.

Each of the cams 57 has an associated one of the shift mechanisms 60 for selecting the desired cam that is to be temporarily aligned with the appropriate bus actuator 55. In order to facilitate this action, the cams are axially slidably mounted on the cam shaft 59 but in a manner which causes them to rotate with the rotation of the shaft 59. For example, at least portions of the shaft 59 may have a hexagonal cross section which slidably accepts an associated hexagonal aperture in each of the cams 57. In operation, each selected cam 57 is axially moved so that its cam registers above its associated actuator 55 by the axial movement (arrows 60A) of the shift mechanism 60 through the actuation of a conventional selector solenoid, not shown for the sake of clarity. Although a single technique is illustrated for accomplishing the selection task, it should be understood that there are other means known and available to those skilled in the art that may be substituted for the technique shown.

The cam shaft 59 is rotatably supported at each end by an appropriate bearing 71 (only one being shown in FIG. 1), and is provided with a drive pulley 73, driven by a cam drive belt 75 coupled to a drive shaft 77 of a cam drive servo motor 79. As seen in FIG. 3, the overhead cam 57, as it is rotated by the rotation of the shaft 59, pushes down on a conventional roller cam follower 81 rotatably mounted at the upper end 83 of the bus actuator shaft 55, forcing the shaft 55 downward in the vacuum manifold. The shaft 55 includes a first slot 85 having an upper side access hole 87, a lower end hole 89, and a reduced diameter lower portion 91 to allow clearance for housing a helical return spring 93. The access hole 87 is positioned to communicate with a hole 95 in an inner side wall 97 of the vacuum manifold 53 when the shaft is near its lowest point of travel, the hole 95 communicating with an elongated vacuum passage 99 in the manifold 53.

FIGS. 4, 5, and 6 show the relationships developed between the lower end portion 61 of each actuator 55 and an associated one of the SMC-holding mechanisms 67 carried by each bus 37. The mechanism 37 includes a head or cap portion 101, the upper surface 65 with an opening 103 therein. The cap 101 is fixedly attached to the upper end of a main sleeve 105 that is, in turn, mounted in the upper portion of body member 107. Within the sleeve 105, a tip sleeve 109 carrying an elongated tubular tip 111 is slidably mounted. A helical return spring 113 is positioned within the sleeve 105 and about the tip sleeve 109 to provide a normal upward bias force on the tip sleeve. The upper portion of the tip sleeve 109 is provided with a tip cap 115 having an upper beveled opening 117 leading to an elongated hole 119 that communicates through an inner tip chamber 121 to an elongated hole 123 in the tubular tip 111. In order to provide some shock-absorbing and good vacuum seal qualities to the mechanism, the tip 111 may be slidably held in the lower portion of the tip sleeve 109 and held there with a downwardly directed bias force provided by an inner helical spring 125 disposed in an elongated cylindrical opening 127 in the tip sleeve 109.

Also mounted in the body member 107 are a pair of opposed jaw members 131, each pivotally attached therein by pins 133 held by appropriate body member-mounted arms 135. A spring 137, mounted in a cavity portion 139 in the body member 107, exerts a jaw-closing pressure on the members 131, which jaws clamp against the lower portion of the tip 111 when not actuated. However, the jaws 131 are forced to pivot away from each other, as seen in FIG. 5, when a lower portion 141 of the tip sleeve 109 is forced (against the bias force provided by the spring 113) in a downward direction by the force of the actuator 55 pushing on the tip cap 115. In this action, the beveled end portion 143 of the lower tip sleeve pushes against similar intermediate inclined surfaces 145 of each opposing jaw 131. When such actuating force is removed by the withdrawal of the lower end portion 61 of an actuator 55, the bias force provided by the springs 113 and 137 cause the tip 111 and its sleeve 109 to move upward, and the jaws 131 to move toward each other as shown in FIG. 6.

In operation, generally speaking, the invention uses pick up means with a plurality of cavities, each accepting a single SMC, which means (bus) is driven by a high speed servo motor (35) via a belt (17). As one bus (37A) is filled with SMC, a second (37B), already loaded bus is being emptied for placement, and a third bus (37C) is returned to the "start" fill position. In this embodiment, one second is allotted for these three concurrent events, providing about 14,400 PPH cycle speed.

More specifically with respect to the operation of a presently preferred embodiment of the invention and following a single bus through the inventive process, an empty bus 37 is indexed to mesh with a temporarily stationary timing belt servo drive system adjacent the first end 19 of the belt 17 by the bracket 41. The system accelerates to the SMC onloading position 23 farthest from the off load point 21, stopping with the appropriate bus mechanism 67 above an SMC carrier tape cavity 40A. The overhead cam mechanism cycles a single revolution causing the bus mechanism to open, pick up the SMC from the carrier 40 using vacuum, and close the jaws of the mechanism. The bus then accelerates to the second farthest SMC position (for example point 25), stops and loads, and repeats this while getting nearer the off load point, until all four bus mechanisms are filled. A final acceleration moves the loaded bus to the SMC off load position (21). (In actual operation, another empty bus is immediately indexed onto the timing belt to be filled.) The loaded bus is then moved one increment to be off loaded. A pneumatic cylinder 171 cycles opening the bus mechanism, lowering the SMC 13 and closing the mechanism 67. The bus is then moved another increment and off loaded to the third and then to the final position. (The aforementioned empty bus is now full and has assumed a position immediately adjacent to the now off loaded bus.) The empty bus is then indexed off the increment move mechanism by an offload index drive 173 coupled to the aforementioned second bracket 43 and is blown (see bus 37C' in the chute 45), using air pressure (arrows 175 ), back to the start position of step one by a conventional air source 179.

From the foregoing it should be evident that there has herein been described a new and improved random access component transport system used in the population of leadless mounted components in printed circuit board fabrication. It can be seen that the invention provides a simple yet reliable electrical component mounting transport system that is capable of mounting of the order of about 14,400 SMC per hour, and which eliminates the problems associated with prior art sequencers. Also, it has been shown that the present invention may, because of its unique configuration, detect a dropped or missing SMC by a conventional photo-optical detection system, for example, prior to off-loading to a printed circuit board.

Although the invention has been described in detail with respect to presently preferred embodiments of the invention, it should be understood that the invention may be practiced using similar functioning but different elements, under the scope of the appended claims.

What is claimed is:

1. A random access surface mounted component transport system used in the population of surface mounted components (SMC) in printed circuit board (PCB) fabrication, including:

an elongated movement mechanism including a multiple SMC carrier, said mechanism having a plurality of adjacent loading points and a downstream off-loading station, said movement mechanism including an overhead cam assembly including a bus-carried SMC-holding mechanism actuator, a different one of said actuators being disposed at each of said loading points;

a plurality of adjacent SMC carrier media disposed adjacent said movement mechanism, each SMC carrier media associated with a different one of said loading points;

loading means positioned adjacent said loading points and said SMC carrier media for moving selected SMC from said carrier media to said multiple SMC carrier of said movement mechanism for transportation of SMC to said off-loading station;

unloading means position adjacent said off-loading station for moving SMC from said multiple SMC carrier to an appropriate position on a PCB in a predetermined sequence; and bus means for transporting said SMC, said bus means including a plurality of bus members temporarily attachable to said time belt upstream of said loading points and temporarily detachable from said time belt adjacent said off-loading station.

2. The random access surface mounted component transport system according to claim 1, wherein said movement mechanism includes a chute dimensioned to slidably support said bus members from said off-loading station to a position upstream of said loading points, when said bus members are not attached to said timing belt.

3. The random access surface mounted component transport system according to claim 2, wherein said movement means also includes return means for moving said bus members within said chute from said off-loading station to said position upstream of said loading points.

4. The random access surface mounted component transport system according to claim 3, wherein said return means is an air source.

5. The random access surface mounted component transport system according to claim 1, wherein said overhead cam assembly includes an elongated vacuum manifold through which each of said mechanism-actuators are disposed, each of said SMC-holding mechanisms including passages communicating with the vacuum environment within said vacuum manifold to extend said vacuum environment to said selected ones of said SMC.

6. The random access surface mounted component transport system according to claim 1, wherein each of said SMC-holding mechanism actuators is selectively actuated through a forked shift mechanism.

7. The random access surface mounted component transport system according to claim 6, wherein each of said forked shift mechanisms is slidably coupled to an associated cam of said overhead cam assembly and adapted to move said cam into and out of said cam's engagement with a selected one of said SMC-holding mechanism actuators.

8. The random access surface mounted component transport system according to claim 1, wherein said overhead cam assembly includes an elongated, cam-supporting cam shaft.

9. The random access surface mounted component transport system according to claim 1, wherein said unloading means includes an off-loader arm cooperating with each of said SMC-holding mechanisms, and includes an increment off-loader system adjacent said off-loader station and receiving said bus members as each detaches from said timing belt, said off-loader system incrementing said bus position to register a different one of said SMC-holding mechanisms with said off-loader arm.

* * * * *